(12) United States Patent
Inaba

(10) Patent No.: US 11,404,421 B2
(45) Date of Patent: Aug. 2, 2022

(54) SEMICONDUCTOR STORAGE DEVICE

(71) Applicant: Kioxia Corporation, Tokyo (JP)

(72) Inventor: Tsuneo Inaba, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/374,186

(22) Filed: Jul. 13, 2021

(65) Prior Publication Data

US 2021/0343717 A1 Nov. 4, 2021

Related U.S. Application Data

(63) Continuation of application No. 17/019,642, filed on Sep. 14, 2020, now Pat. No. 11,094,698.

(30) Foreign Application Priority Data

Dec. 27, 2019 (JP) .............................. JP2019-239101

(51) Int. Cl.
| | | |
|---|---|---|
| *G11C 5/02* | (2006.01) | |
| *H01L 27/108* | (2006.01) | |
| *G11C 11/4097* | (2006.01) | |
| *G11C 11/4091* | (2006.01) | |

(52) U.S. Cl.
CPC .. H01L 27/10802 (2013.01); H01L 27/10805 (2013.01); *G11C 11/4091* (2013.01); *G11C 11/4097* (2013.01)

(58) Field of Classification Search
CPC ......... H01L 27/10802; H01L 27/10805; G11C 11/4091; G11C 11/4097

USPC .............................................. 365/149, 51, 63
See application file for complete search history.

(56) References Cited

U.S. PATENT DOCUMENTS

| | | | | |
|---|---|---|---|---|
| 6,337,497 | B1 * | 1/2002 | Hanafi | ............. H01L 27/10808 345/182 |
| 6,858,893 | B2 | 2/2005 | Ishibashi | |
| 7,223,678 | B2 | 5/2007 | Noble | |
| 7,838,925 | B2 * | 11/2010 | Roesner | ............ H01L 27/10876 257/E29.262 |

(Continued)

FOREIGN PATENT DOCUMENTS

| | | |
|---|---|---|
| JP | 2003-179161 A | 6/2003 |
| JP | 2015-226001 A | 12/2015 |
| JP | 2017-168623 A | 9/2017 |

*Primary Examiner* — Viet Q Nguyen
(74) *Attorney, Agent, or Firm* — Foley & Lardner LLP

(57) ABSTRACT

A semiconductor storage device according to the present embodiment includes a plurality of first wires provided above a surface of a semiconductor substrate to extend in a first direction, and a plurality of second wires provided above the first wires to extend in a second direction crossing the first direction. A plurality of capacitor elements are arranged every other intersection region among intersection regions between the first wires and the second wires as viewed from above the surface of the semiconductor substrate. A plurality of transistors are provided above the capacitor elements to correspond thereto, respectively. A first distance between two of the capacitor elements, which are adjacent to each other in the first direction, is narrower than a second distance between two of the capacitor elements, which are adjacent to each other in the second direction.

20 Claims, 18 Drawing Sheets

(56) References Cited

U.S. PATENT DOCUMENTS

| | | | |
|---|---|---|---|
| 8,994,084 B2* | 3/2015 | Lin | H01L 27/10885 |
| | | | 257/329 |
| 9,698,272 B1 | 7/2017 | Ikeda | |
| 9,842,839 B1 | 12/2017 | Sills et al. | |
| 10,026,740 B1 | 7/2018 | Zang et al. | |
| 10,103,053 B1* | 10/2018 | Sukekawa | H01L 21/76256 |
| 10,347,322 B1 | 7/2019 | Kim et al. | |
| 10,410,912 B2* | 9/2019 | Sukekawa | H01L 29/78603 |
| 10,607,923 B1 | 3/2020 | Juengling | |
| 10,714,629 B2* | 7/2020 | Saito | H01L 27/10873 |
| 10,861,787 B1 | 12/2020 | Sukekawa et al. | |
| 10,872,894 B2 | 12/2020 | Juengling | |
| 10,896,722 B1 | 1/2021 | Li et al. | |
| 2012/0275217 A1 | 11/2012 | Rountree | |
| 2015/0357336 A1* | 12/2015 | Sukekawa | H01L 27/10823 |
| | | | 257/334 |
| 2018/0061481 A1 | 3/2018 | Kawamura et al. | |
| 2018/0061840 A1 | 3/2018 | Sills | |
| 2018/0197864 A1 | 7/2018 | Sills | |
| 2018/0218765 A1 | 8/2018 | Derner et al. | |
| 2019/0006365 A1 | 1/2019 | Derner et al. | |
| 2019/0067288 A1 | 2/2019 | Juengling | |
| 2019/0267328 A1 | 8/2019 | Fumagalli et al. | |
| 2019/0393224 A1 | 12/2019 | Wang et al. | |
| 2020/0051614 A1 | 2/2020 | Derner et al. | |
| 2020/0066731 A1 | 2/2020 | Iwaki | |
| 2020/0075077 A1 | 3/2020 | Kim et al. | |
| 2020/0388619 A1 | 12/2020 | Sukekawa et al. | |
| 2020/0411078 A1 | 12/2020 | Sharma et al. | |

* cited by examiner

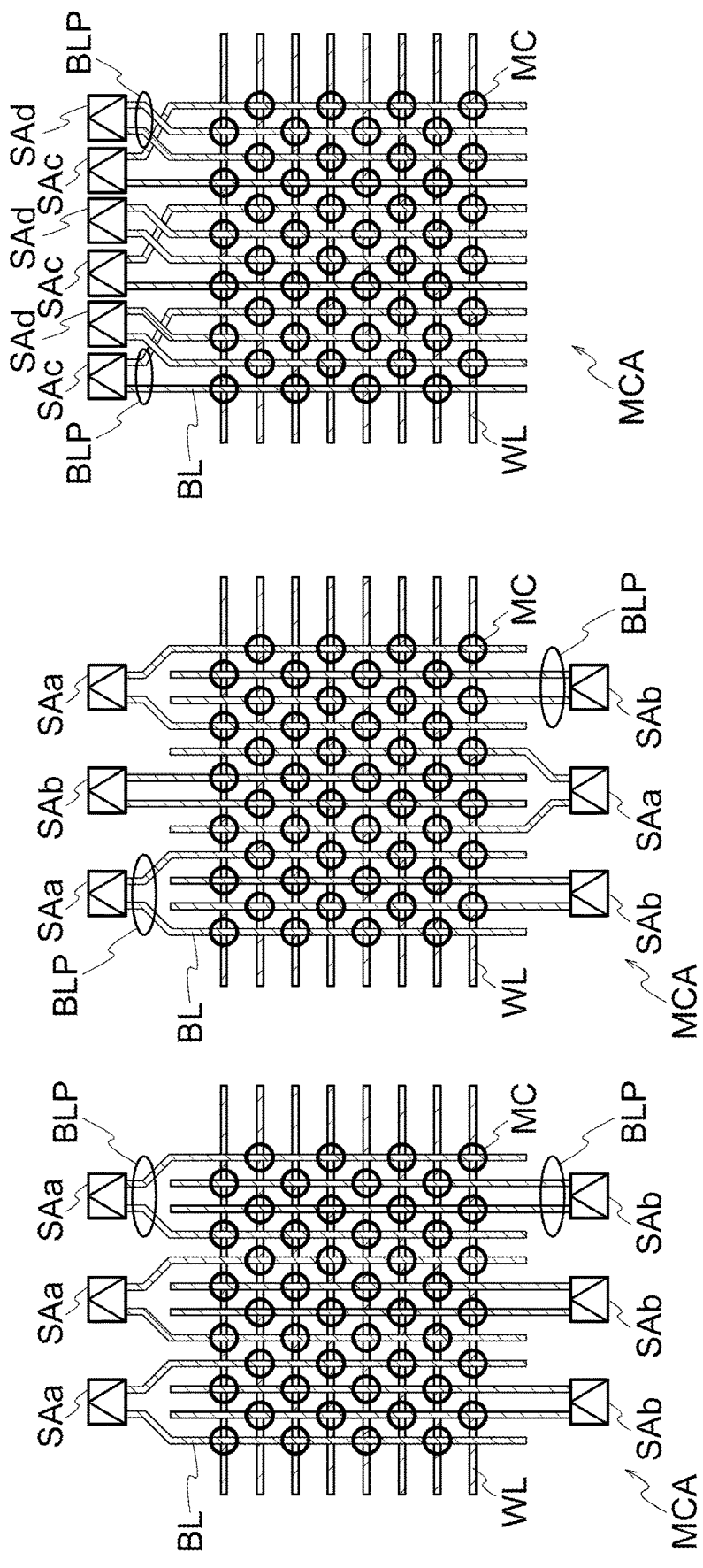

SEMICONDUCTOR STORAGE DEVICE

CROSS REFERENCE TO RELATED APPLICATIONS

This application is a continuation of U.S. patent application Ser. No. 17/019,642, filed on Sep. 14, 2020, which is based upon and claims the benefit of priority from the prior Japanese Patent Application No. 2019-239101, filed on Dec. 27, 2019, the entire contents of all of the above applications are incorporated herein by reference.

FIELD

The embodiments of the present invention relate to a semiconductor storage device.

BACKGROUND

A 1T (Transistor)-1C (Capacitor) semiconductor storage device that uses a vertical transistor as a switching transistor is being developed in recent years. The vertical transistor uses, as a channel, a semiconductor pillar extending substantially perpendicularly to a main surface of a semiconductor substrate, and includes a gate electrode (a word line) that extends substantially in parallel to the main surface, around the semiconductor pillar.

In order to increase an on-current (a current driving capability) of this vertical transistor, it is considered to make the semiconductor pillar thick to increase the gate width of the vertical transistor. However, when the semiconductor pillar is made thick, the word line therearound becomes narrower, resulting in increase of the word line resistance. Alternatively, it is necessary to increase the width of the word line in order to keep the word line resistance low. Further, making the semiconductor pillar thick or increasing the width of the word line is disadvantageous to downsizing of a memory cell array.

Accordingly, the current driving capability of the vertical transistor and downsizing of the memory cell array have a trade-off relation.

BRIEF DESCRIPTION OF THE DRAWINGS

FIG. 14A is a schematic plan view illustrating an arrangement of another folded bit-line configuration;

FIG. 14B is a schematic plan view illustrating an arrangement of another folded bit-line configuration;

FIG. 14C is a schematic plan view illustrating an arrangement of another folded bit-line configuration;

DETAILED DESCRIPTION

Figure 1A:
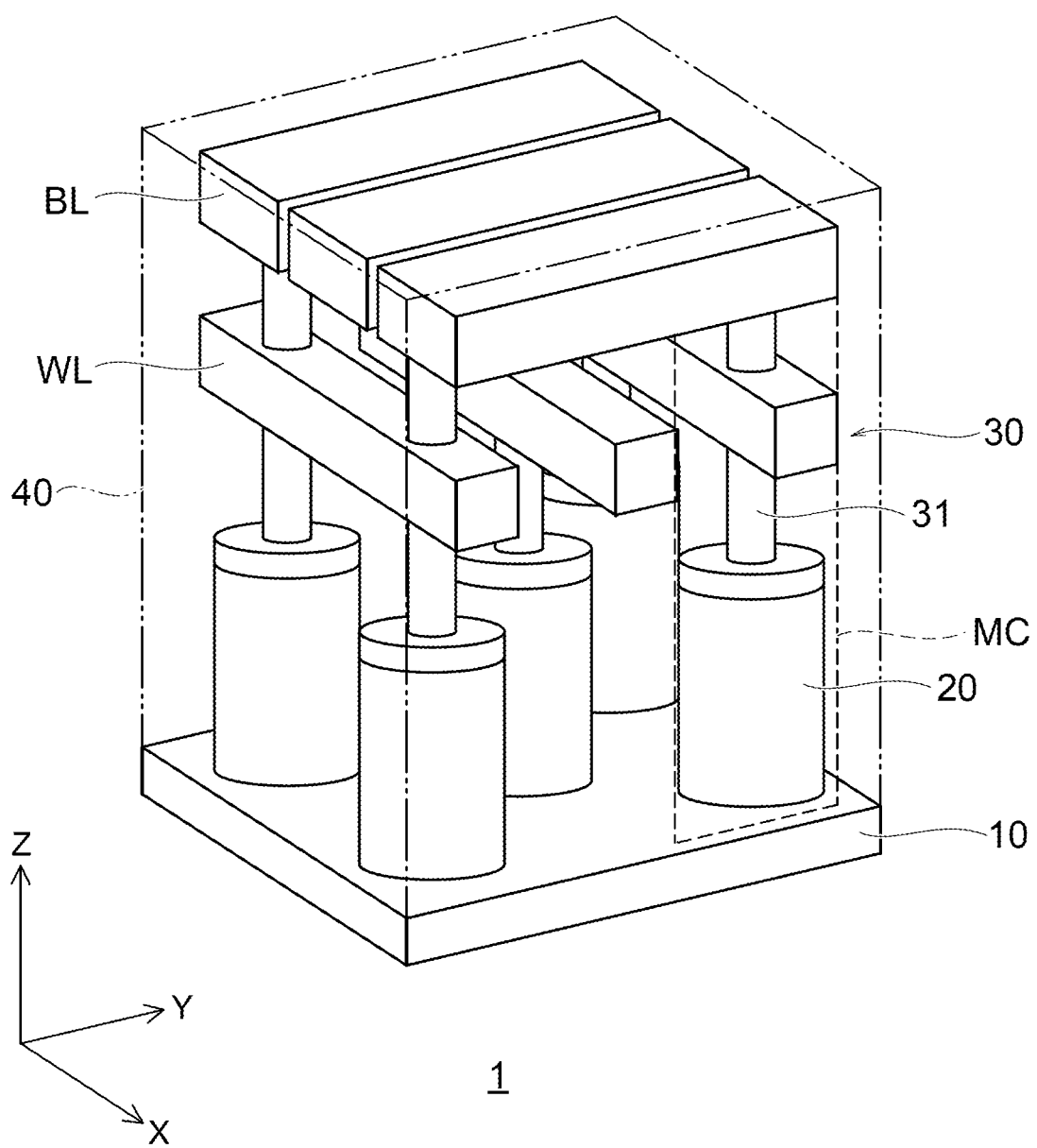
FIG. 1A is a perspective view illustrating a configuration example of a semiconductor storage device according to the present embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor storage device according to the present embodiment includes a plurality of first wires provided above a surface of a semiconductor substrate to extend in a first direction, and a plurality of second wires provided above the first wires to extend in a second direction crossing the first direction. A plurality of capacitor elements are arranged every other intersection region among intersection regions between the first wires and the second wires as viewed from above the surface of the semiconductor substrate. A plurality of transistors are provided above the capacitor elements to correspond thereto, respectively. A first distance between two of the capacitor elements, which are adjacent to each other in the first direction, is narrower than a second distance between two of the capacitor elements, which are adjacent to each other in the second direction.

FIG. 1A is a perspective view illustrating a configuration example of a semiconductor storage device 1 according to the present embodiment. The semiconductor storage device 1 includes a semiconductor substrate 10, a plurality of word lines WL, a plurality of bit lines BL, a plurality of capacitor elements 20, and a plurality of cell transistors 30. The semiconductor storage device 1 may be, for example, a DRAM (Dynamic Random Access Memory). However, the application of the present embodiment is not limited to a DRAM. The present embodiment can be applied to any 1T-1C memory. A pair of one capacitor element 20 and one cell transistor 30 corresponding thereto functions as one memory cell MC. The memory cell MC may be an mT-1C type memory (m is an integer of 2 or more). That is, the cell transistor of the memory cell MC may be configured by a plurality of the cell transistors 30 connected in parallel to each other whose source terminals and drain terminals are each connected in common. In this case, the cell transistors connected in parallel to each other are connected to the capacitor element.

The semiconductor substrate 10 is made of silicon monocrystal, for example. The word lines WL that extend in an X-direction are provided above a surface of the semiconductor substrate 10. The word lines WL extend substantially in parallel to each other and are arranged in a Y-direction that crosses the X-direction at substantially regular intervals.

The bit lines BL that extend in the Y-direction are provided above the word lines WL. The bit lines BL extend substantially in parallel to each other and are arranged in the X-direction at substantially regular intervals.

The capacitor elements 20 are two-dimensionally arranged on the surface of the semiconductor substrate 10. One electrode Et (see FIG. 1B) of each capacitor element 20 is connected to the corresponding cell transistor 30, and the other electrode Eb (see FIG. 1B) is connected to the semiconductor substrate 10. The configuration of the capacitor element 20 is not specifically limited. The capacitor element 20 receives charges (for example, electrons) and accumulates them therein via the cell transistor 30, or discharges charges. Accordingly, the capacitor element 20 functions as a charge accumulator. The configuration of the capacitor element 20 and the corresponding cell transistor 30 will be described later with reference to FIG. 1B.

Figure 11:
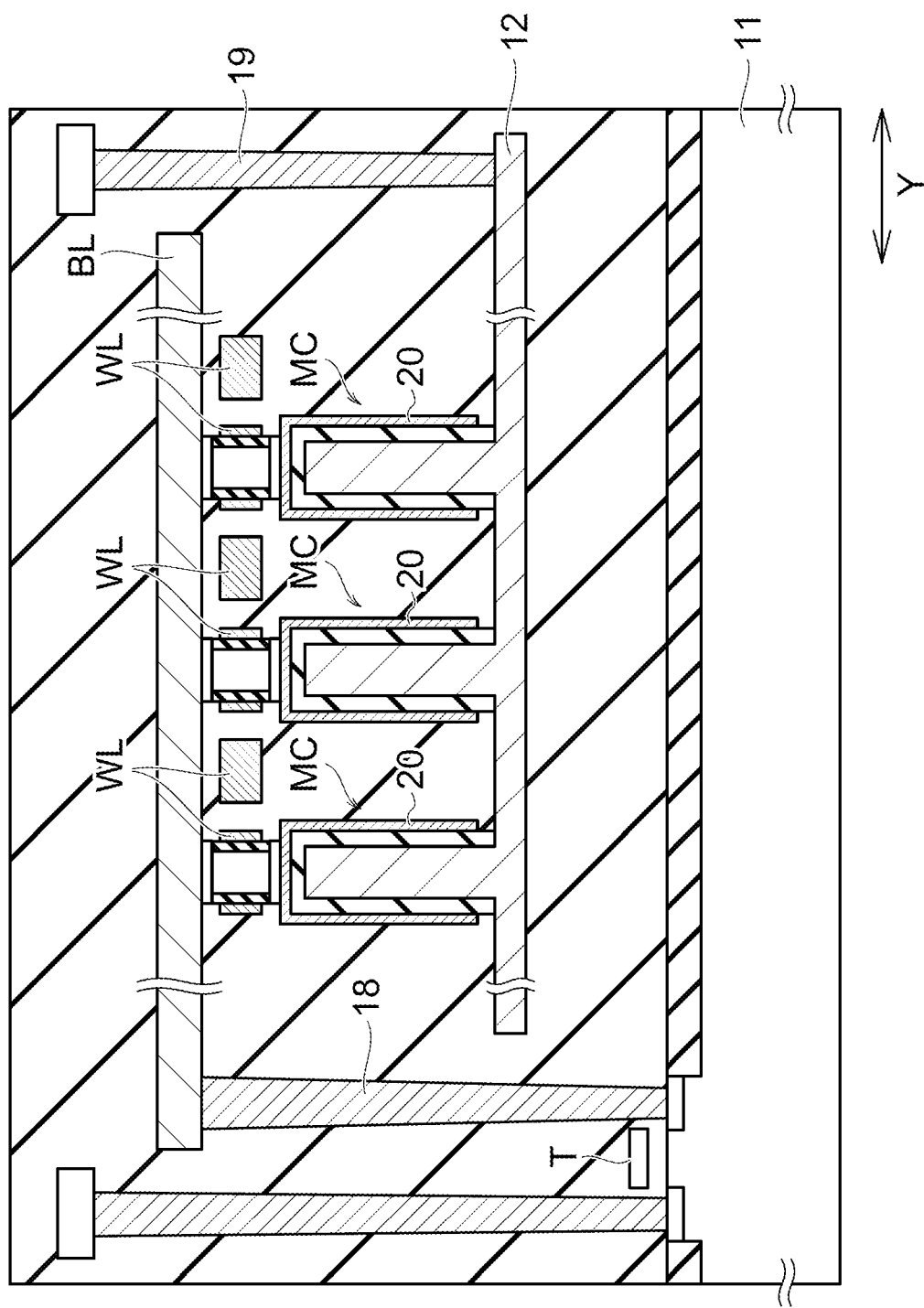
FIG. 11 is a cross-sectional view illustrating a first modification of a DRAM according to the present embodiment.
Figure 12:
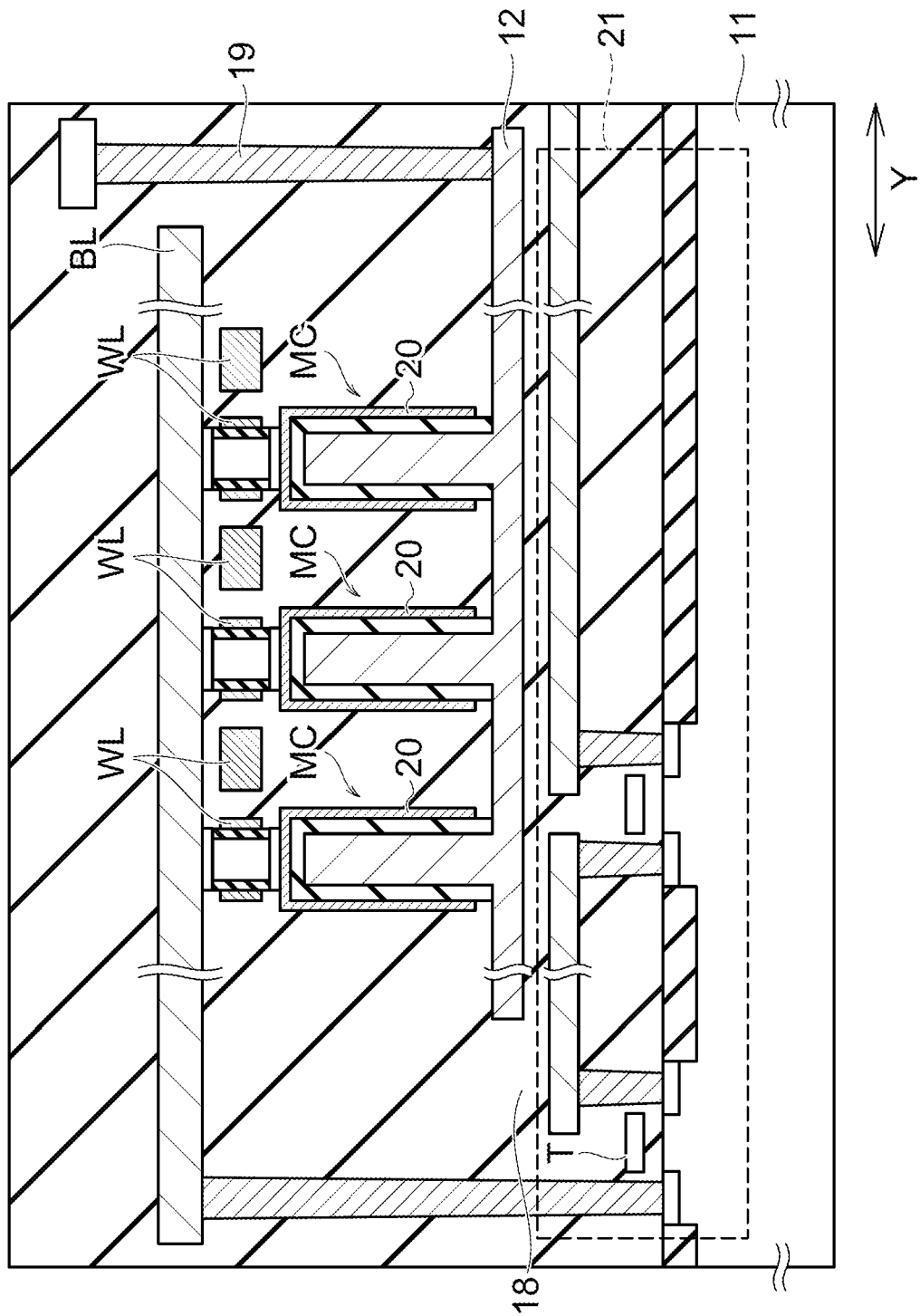
FIG. 12 is a cross-sectional view illustrating a second modification of the DRAM according to the present embodiment.

In the present embodiment, the memory cell MC is provided on the semiconductor substrate 10. However, as illustrated in FIGS. 11 and 12, the memory cell MC may be provided on a plate electrode (an electrode made of an electrically conducting material, such as doped polysilicon, metal, or silicide) 12 that is provided on the semiconductor substrate 10 or a peripheral circuit.

The cell transistors 30 are provided above the capacitor elements 20 to correspond thereto, respectively. Each of the cell transistors 30 includes a semiconductor pillar 31. Each semiconductor pillar 31 is provided to penetrate through a certain one word line WL from the corresponding capacitor element 20 and to reach one of the bit lines BL. The lower end of the semiconductor pillar 31 is connected to the electrode Et (see FIG. 1B) of the capacitor element 20, and the upper end is connected to the bit line BL. Accordingly, the cell transistor 30 is configured which includes the word line WL as a gate electrode and the semiconductor pillar 31 as a channel region.

The semiconductor pillar 31 is formed of, for example, an oxide semiconductor, and more specifically, IGZO (InGaZnO) containing indium oxide, gallium oxide and zinc oxide, for example. The cell transistor 30 is, for example, a three-terminal element. The three-terminal element operates with a source terminal, a drain terminal, and a gate terminal and does not include a body contact. Therefore, no body voltage is applied to the semiconductor pillar 31, and the cell transistor 30 is a switching element that operates with three terminals (the source, drain, and gate terminals). The source terminal of the cell transistor 30 is connected to the electrode Et (see FIG. 1B) of the capacitor element 20, the drain terminal is connected to one bit line BL, and the gate terminal is connected to one word line WL. The transistor (hereinafter, "oxide semiconductor transistor") that is the above-described three-terminal element using an oxide semiconductor for a channel region (a body portion) includes a channel portion formed by a wide-band-gap oxide semiconductor and does not include a PN junction portion. Therefore, in a case of using the oxide semiconductor transistor as the cell transistor 30, an off-leakage current of the cell transistor 30 is extremely small and no junction leakage occurs. Accordingly, the amount of charges leaking from the capacitor element 20 via the cell transistor 30 is small. Therefore, the capacity of the capacitor element 20 can be made small by using the oxide semiconductor transistor as the cell transistor 30. As a result, the memory cell MC can be downsized. Downsizing of the memory cell MC leads to reduction of the layout area of the entire memory cell array of the semiconductor storage device 1, so that the manufacturing cost can be reduced. Further, because of a smaller leakage current in the cell transistor 30, the frequency of a refresh operation can be reduced, so that power consumption can be reduced. An insulating material, for example, a pillar silicon oxide film may be provided at the center of the semiconductor pillar 31, and an oxide semiconductor such as IGZO may be provided around that insulating material. That is, the oxide semiconductor in the semiconductor pillar 31 may be formed to have a tubular shape, for example, a macaroni-like shape.

Meanwhile, when the amount of charges to be accumulated in each memory cell MC is small, write data or read data becomes sensitive to noise and noise immunity becomes lower. Therefore, a so-called folded bit-line configuration is employed in order to ensure noise immunity in the present embodiment. The folded bit-line configuration will be described later.

The capacitor elements 20, the cell transistors 30, the word lines WL, and the bit lines BL on the semiconductor substrate 10 are covered with an interlayer dielectric film 40 that is formed by an insulating film, for example, a silicon oxide film.

In a case of selectively accessing a certain memory cell MC, an on-voltage is applied to a selected one of the word lines WL, and a write voltage or a read voltage is applied to a selected one of the bit lines BL. Accordingly, in a write operation, for example, the cell transistor 30 of the selected memory cell MC corresponding to an intersection between the selected word line WL and the selected bit line BL is placed in an electrically conducting state (an ON state), so that charges are accumulated in the capacitor element 20. In a volatile memory such as a DRAM, the charges accumulated in the capacitor element 20 are eliminated via the cell transistor 30 or the like with time. Therefore, it is necessary to regularly carry out a retention (refresh) operation in order to maintain the charges accumulated in the capacitor element 20. Meanwhile, according to the present embodiment, by using an oxide semiconductor transistor as the cell transistor 30 as described above, it is possible to reduce a leakage current in the cell transistor 30, thus reducing the frequency of the retention operation.

Further, according to the present embodiment, the capacitor element 20 is provided on the semiconductor substrate 10, and the cell transistor 30 is provided above the capacitor element 20.

In a case where the capacitor element 20 is provided above the cell transistor 30, a contact plug is required by the side of the memory cell MC in order to connect an electrode of the capacitor element 20 and the semiconductor substrate 10 to each other. This contact plug increases the layout area of a memory cell array MCA.

On the contrary, in the present embodiment, it is unnecessary to provide this contact plug that connects an electrode of the capacitor element 20 and the semiconductor substrate 10 to each other. Accordingly, the memory cell array MCA can be downsized.

Figure 1B:
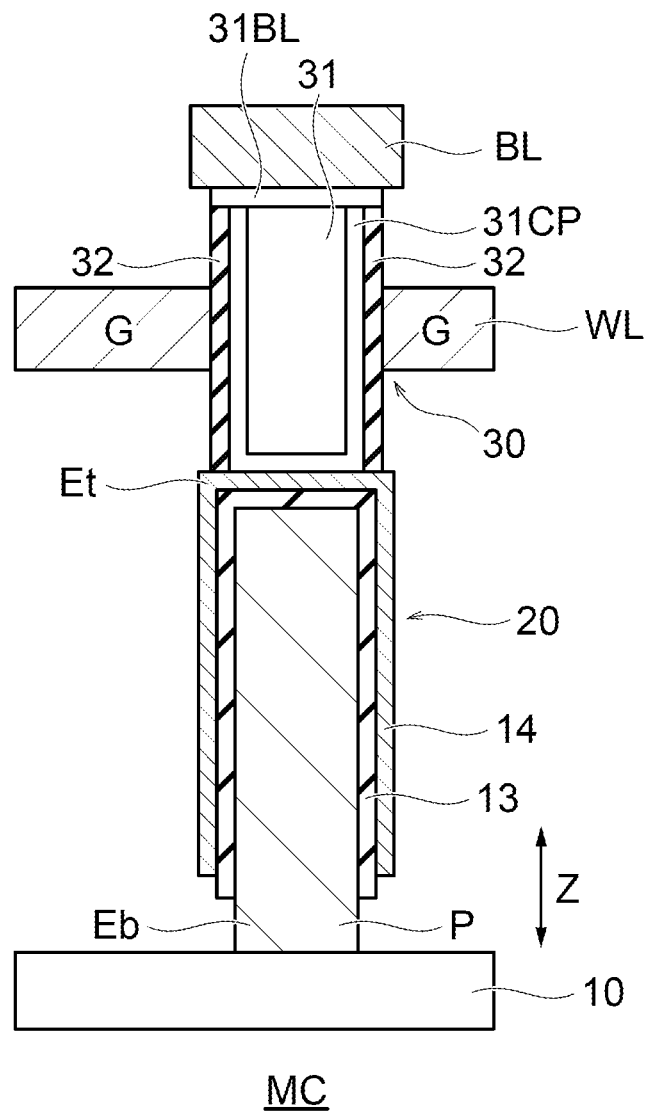
FIG. 1B is a cross-sectional view illustrating a configuration example of one memory cell.

FIG. 1B is a cross-sectional view illustrating a configuration example of one memory cell MC. As illustrated in FIG. 1B, the memory cell MC includes the capacitor element 20 on the semiconductor substrate 10 and the cell transistor 30 on the capacitor element 20.

The capacitor element 20 includes an electrode pillar P connected to the semiconductor substrate 10, an insulating portion 13 covering the electrode pillar P, and a cell electrode 14 covering the insulating portion 13. The electrode pillar P and the cell electrode 14 are electrically insulated from each other by the insulating portion 13 and configure two electrodes.

The cell transistor 30 includes the oxide semiconductor layer (the semiconductor pillar) 31 as a channel region (a current path), supplemental layers 31CP and 31BL, a gate insulating layer 32, and the word line WL.

The capacitor element 20 in FIG. 1B is a so-called fin type capacitor. Although the shape of the capacitor element 20 is columnar, it is not limited thereto. A metal material, for example, copper or tungsten is used for the electrode pillar P and the cell electrode 14. For the insulating portion 13, copper oxide, tungsten oxide, silicon oxide, aluminum oxide, hafnium oxide, zirconium oxide, tantalum oxide, or a multilayer structure of these oxides is used, for example. The electrode pillar P is electrically connected to the semiconductor substrate 10. Meanwhile, the cell electrode 14 is electrically connected to the semiconductor pillar 31 of the cell transistor 30 via the supplemental layer 31CP.

The cell transistor 30 is a vertical transistor that includes the semiconductor pillar 31 formed of an oxide semiconductor (for example, IGZO) as a channel arranged above the capacitor element 20 and in which the channel-length direction crosses (for example, crosses at right angles) a surface of the semiconductor substrate 10. The semiconductor pillar 31 penetrates through the word line WL. That is, the word line WL surrounds the side surface (the circumference) of the semiconductor pillar 31. In this case, the channel width of the cell transistor 30 is the circumferential direction of the semiconductor pillar 31, and therefore the length in the circumferential direction of the semiconductor pillar 31 affects the current driving capability of the cell transistor 30.

A lower-end electrode of the semiconductor pillar 31 is electrically connected to the cell electrode 14 via the supplemental layer 31CP, and an upper-end electrode is connected to the bit line BL via the supplemental layer 31BL.

The supplemental layer 31CP is provided between the semiconductor pillar 31 and the cell electrode 14. The supplemental layer 31BL is provided between the semiconductor pillar 31 and the bit line BL. This is to prevent oxygen in the semiconductor pillar 31 from forming a metal oxide layer with a high resistance at an interface between the semiconductor pillar 31 and the cell electrode 14 and at an interface between the semiconductor pillar 31 and the bit line BL. That is, the supplemental layers 31BL and 31CP each serve as a barrier layer that prevents a reaction between the semiconductor pillar 31 and the bit line BL or the cell electrode 14.

A metal material that reacts with oxygen in the semiconductor pillar 31 to form a metal oxide layer with a high resistance is unfavorable as the material of the supplemental layers 31BL and 31CP. Further, a material that oxidizes the bit line BL or the cell electrode 14 is also unfavorable as the supplemental layers 31BL and 31CP. Therefore, it is preferable to use oxide that is large in a dissociation energy of oxygen for the supplemental layers 31BL and 31CP. However, it is desirable that the supplemental layers 31BL and 31CP are each formed to be very thin in order not to disturb electric connection between the cell transistor 30 and the capacitor element 20 or the bit line BL.

Figure 2:
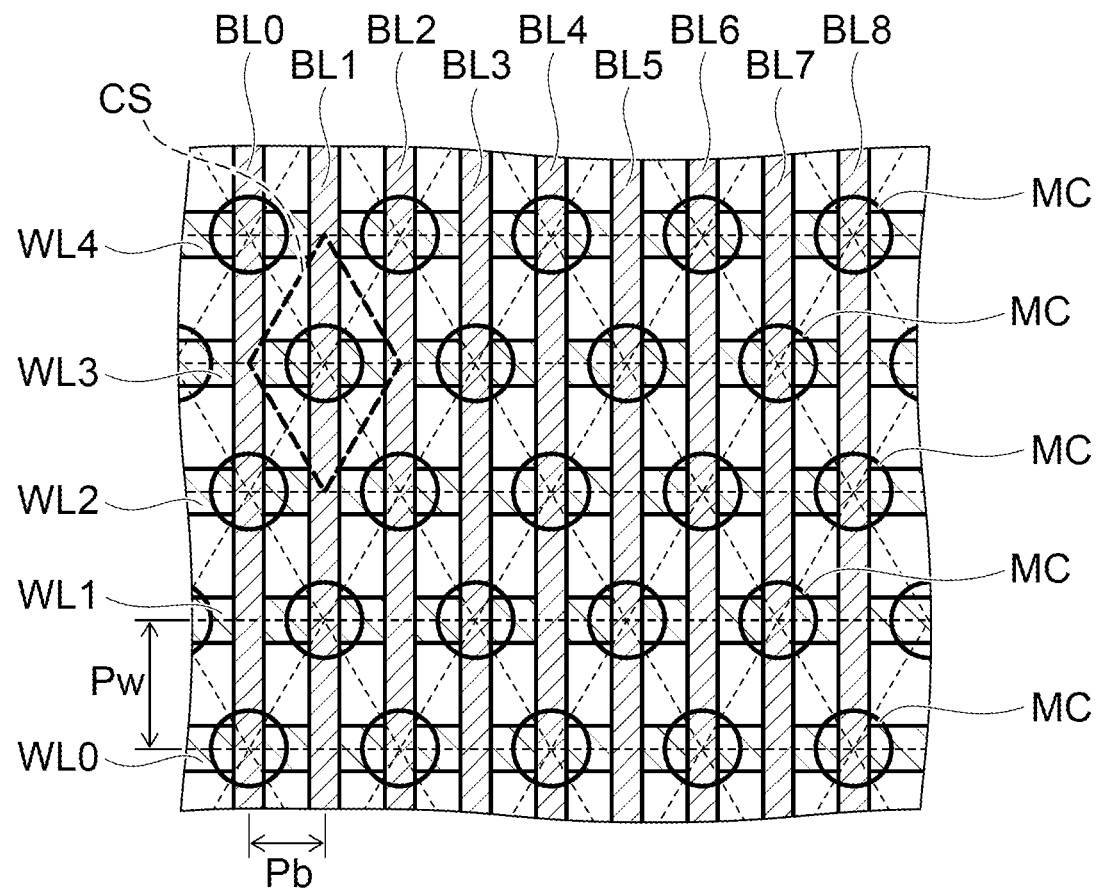
FIG. 2 is a plan view illustrating a configuration example of the semiconductor storage device according to the present embodiment.

FIG. 2 is a plan view illustrating a configuration example of the semiconductor storage device 1 according to the present embodiment. FIG. 2 illustrates a positional relation between the word lines WL, the bit lines BL, and the memory cells MC. The number of the word lines WL and the number of the bit lines BL are not specifically limited.

Word lines WL0 to WL4 extend in the X-direction and are substantially in parallel to each other. A pitch Pw between the word lines WL adjacent to each other is about 1.7 F. F (Feature size) is the minimum processing dimension in a semiconductor manufacturing process.

Bit lines BL0 to BL8 extend in the Y-direction and are substantially in parallel to each other. A pitch Pb between the bit lines BL adjacent to each other is about 1 F. That is, the pitch Pb between the bit lines BL0 to BL8 is narrower than the pitch Pw between the word lines WL0 to WL4. Further, in this case, a unit of one memory cell MC in a planar layout (the layout area per unit cell) is 3.4 $F^2$ (2F×1.7F×2/2=3.4 $F^2$).

As illustrated in FIG. 2, the word lines WL0 to WL4 and the bit lines BL0 to BL8 cross (for example, cross at right angles) each other as viewed from above the semiconductor substrate 10. The memory cells MC are arranged every other intersection among intersections between the word lines WL0 to WL4 and the bit lines BL0 to BL8 in the X-direction and the Y-direction. That is, the memory cells MC arranged in the X-direction are arranged every other bit line BL. The memory cells MC arranged in the Y-direction are arranged every other word line WL. In other words, the memory cells MC are arranged to be shifted by half a pitch in each of the X-direction and the Y-direction.

Accordingly, the centers of the memory cells MC (the centers of capacitor elements) are arranged planarly in a closed-packed manner (that is, hexagonal close packing) as viewed from above a surface of the semiconductor substrate 10. That is, when attention is paid to one memory cell MC, six memory cells MC are adjacent to that memory cell MC substantially equidistantly therefrom. These six memory cells MC are arranged at vertices of a substantially regular hexagon, respectively. In this case, three memory cells MC adjacent to each other form a substantial triangle that has a side extending in the X-direction, and are located at respective vertices of that triangle. In a case where the above-described six memory cells MC are arranged at respective vertices of a substantially regular hexagon, the triangle formed by the mutually adjacent three memory cells MC is a substantially regular triangle.

Further, when attention is paid to four capacitor elements 20 adjacent to each other in the X-direction and the Y-direction, these four capacitor elements 20 are located at vertices of a quadrangle that has a diagonal in the X-direction and a diagonal in the Y-direction and is substantially diamond-shaped. Because the pitch Pb is narrower than the pitch Pw, the diagonal in the X-direction of the quadrangle formed by the four capacitor elements 20 is shorter than the diagonal in the Y-direction. Therefore, in a planar layout, the quadrangle formed by the four capacitor elements 20 is an elongate diamond that is long in a direction of the bit lines BL (in the Y-direction). This arrangement of the memory cells MC makes the pitch Pb of the bit lines BL relatively narrow and the pitch Pw of the word lines WL relatively wide.

Because of increase of the pitch Pw of the word lines WL, the width of the word lines WL can be increased. It is thus possible to reduce the resistance of the word line WL and increase an operating speed of the cell transistor 30. Meanwhile, reduction of the pitch Pb of the bit lines BL causes a problem of coupling noise between the bit lines BL. In the present embodiment, this noise problem is solved by a folded bit-line configuration that will be described later. Further, the memory cells MC are arranged every other bit line BL or every other word line WL in each of the X-direction and the Y-direction. Because of this arrangement, the folded bit-line configuration can be achieved.

Figure 3A:
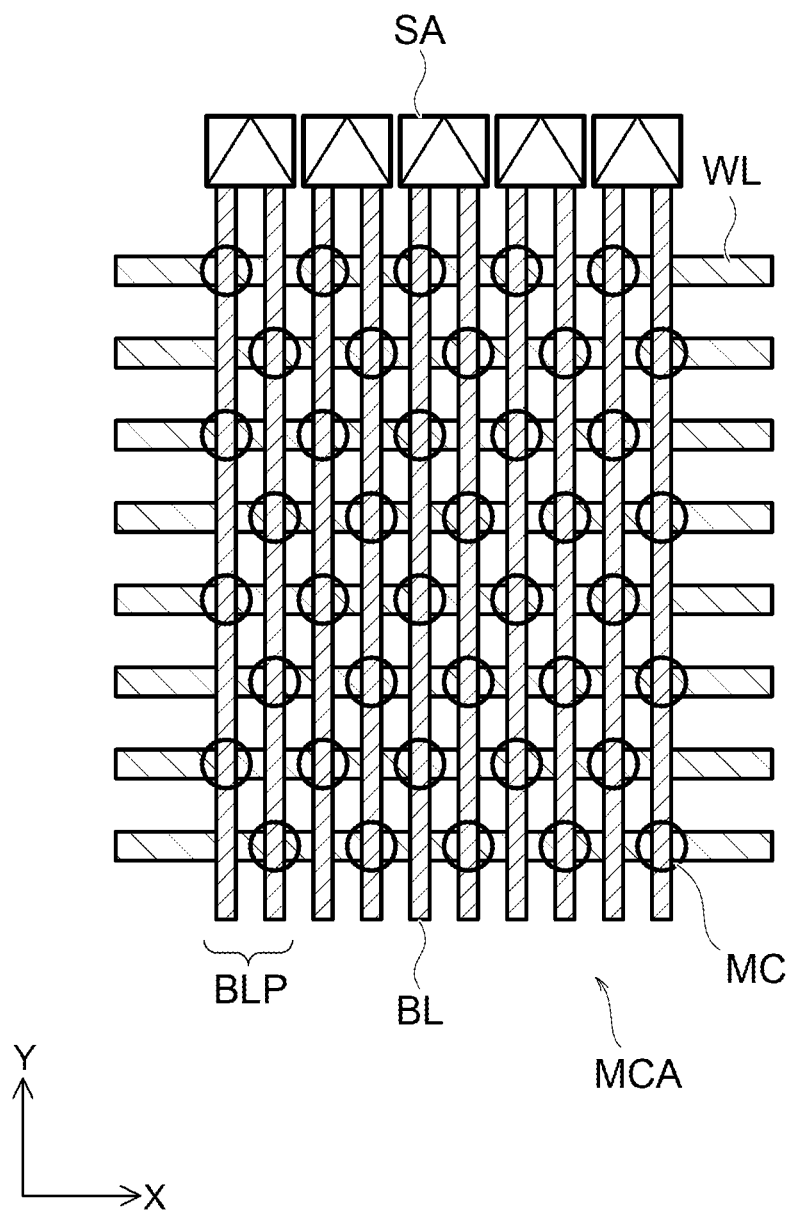
FIG. 3A is a schematic plan view illustrating an arrangement of a folded bit-line configuration.
Figure 3B:
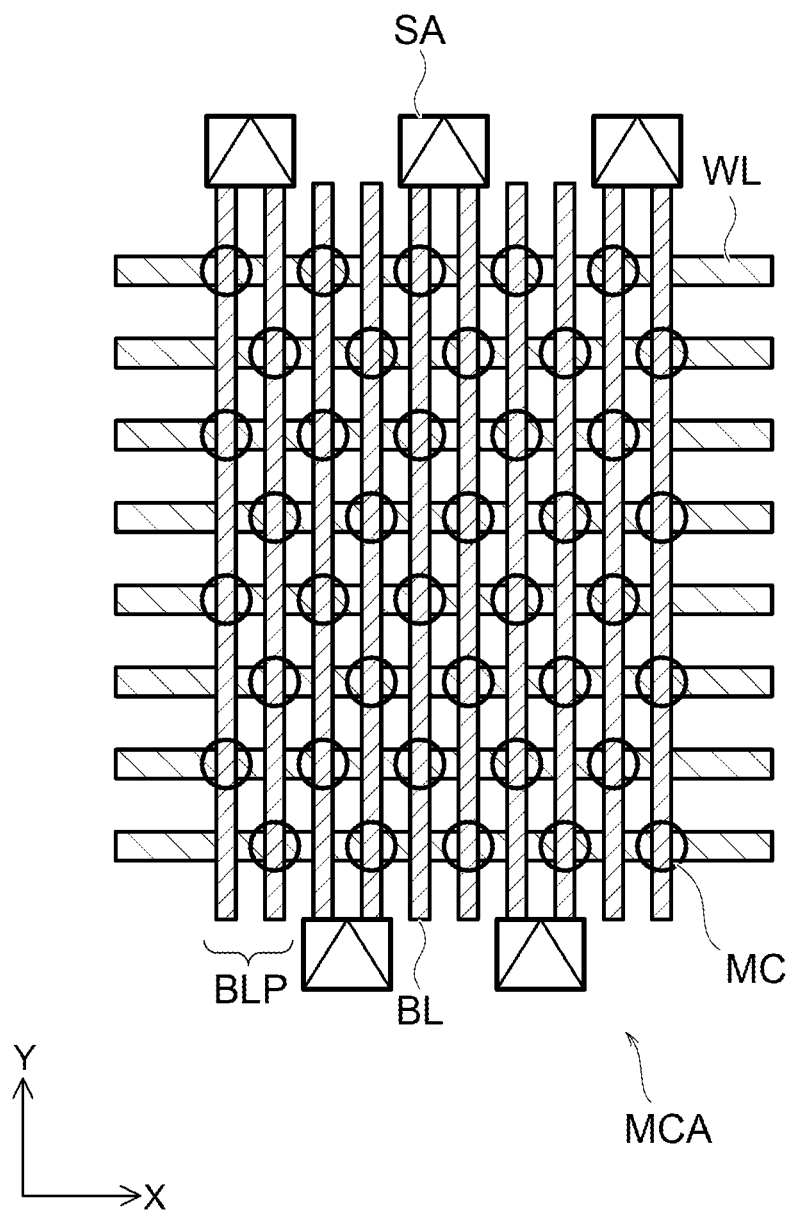
FIG. 3B is a schematic plan view illustrating an arrangement of the folded bit-line configuration.
Figure 3C:
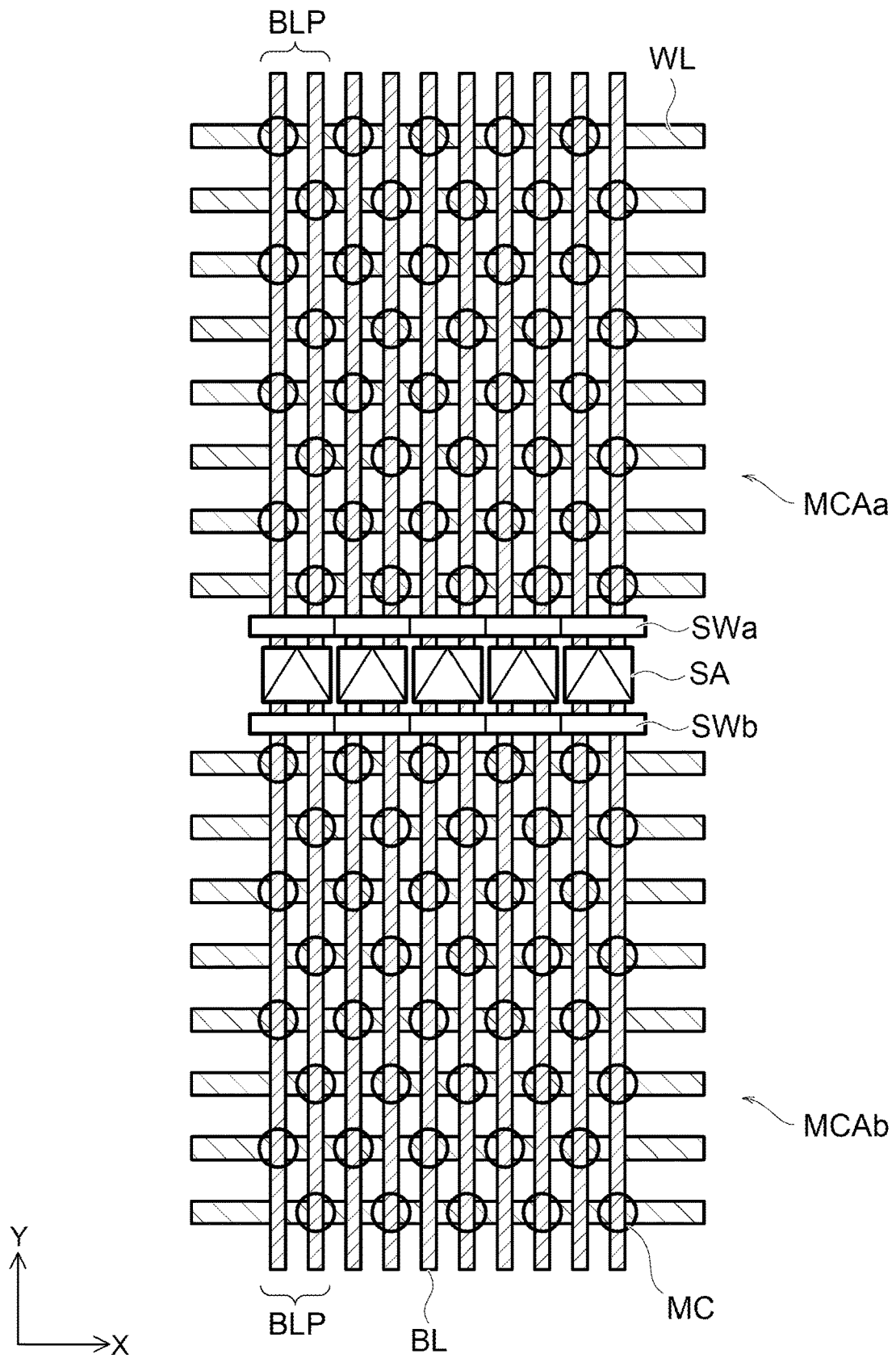
FIG. 3C is a schematic plan view illustrating an arrangement of the folded bit-line configuration.

FIGS. 3A to 3C are schematic plan views illustrating arrangements of folded bit-line configurations. In each folded bit-line configuration, a pair BLP of two bit lines BL adjacent to each other is connected to one sense amplifier SA. The sense amplifier SA uses data obtained from one of the bit lines BL of the bit line pair BLP as reference data and data obtained from the other bit line BL as signal data, and compares the signal data and the reference data with each other to detect a logic of the signal data. As described above, the sense amplifier SA is connected to one end of the bit line pair BLP of two adjacent bit lines and is configured as if the bit line BL is folded back in the sense amplifier SA. This configuration is therefore called a folded bit-line configuration.

In the folded bit-line configuration, the bit line pair BLP of two adjacent bit lines is used for writing and detecting data. That is, the two bit lines BL of the bit line pair BLP are close to each other. For example, in a case where noise is coupled to a bit line BL from an activated word line, noise is coupled to both the two bit lines BL that form the bit line pair BLP. In a case where noise is coupled to both the reference data and the signal data, that is, in a case of common mode noise, in a sense amplifier that employs differential sensing, the amount of a read signal is reduced by a difference between the noise coupled to the reference data and the noise coupled with the signal data. Meanwhile, in an open bit-line configuration, noise is coupled to signal data only in the same case. Therefore, the amount of a read signal is reduced by the coupled noise. Accordingly, the folded bit-line configuration has an advantage that it is superior to the open bit-line configuration in noise immunity.

Therefore, the semiconductor storage device 1 according to the present embodiment can increase noise immunity by employing a folded bit-line configuration, even if an oxide semiconductor transistor is used as the cell transistor 30 to downsize the memory cell MC and the pitch Pb between the bit lines BL is made narrow.

Although not illustrated, the open bit-line configuration obtains reference data and signal data from a bit line extending on one side of a sense amplifier and a bit line extending on the other side of the sense amplifier, respectively. In this case, the bit lines forming a pair are not adjacent to each other, and noise tends to be coupled into either one of the bit lines only. Therefore, the open bit-line configuration is inferior to the folded bit-line configuration in noise immunity. Accordingly, in a case where the open bit-line configuration is employed, the effective amount of a read signal (a difference between the reference data and the signal data) is reduced by noise in a read operation, for example. To make up for this reduction of the signal amount, it is necessary to take measures such as increasing the capacity of the capacitor element 20. In this case, it is necessary to change an insulator of the capacitor element 20 to a high dielectric material or increase the height of the capacitor element 20. In a case of increasing the height of the capacitor element 20, for example, the position of the bit line BL illustrated in FIG. 11 becomes higher, so that the height (the depth) of a contact plug 18 becomes higher. Accordingly, a resistance of contact between the bit line BL and a transistor T increases. Alternatively, the aspect ratio of the contact plug 18 becomes higher, causing a problem such as reduction of the production yield. Therefore, the open bit-line configuration is not suitable for the semiconductor storage device 1 in which an oxide semiconductor transistor is used as a cell transistor and the pitch between bit lines is made narrow as in the present embodiment.

In the configuration of FIG. 3A, the sense amplifiers SA are provided at one end in the Y-direction (on one side) of the memory cell array MCA and are arranged on only one side of the bit lines BL.

In the configuration of FIG. 3B, the sense amplifiers SA are provided at both ends in the Y-direction (on both sides) of the memory cell array MCA and are arranged alternately for each bit line pair BLP. For example, for a certain bit line pair BLP, the sense amplifier SA is arranged on one-end side. For a bit line pair BLP adjacent to that certain bit line pair BLP, the sense amplifier SA is arranged on the other-end side.

In the configuration of FIG. 3C, the sense amplifiers SA are provided between two memory cell arrays MCAa and MCAb, and each sense amplifier SA is connected to the bit line pair BLP of either the memory cell array MCAa or MCAb selectively. Switching elements SWa are provided between the sense amplifiers SA and the bit line pairs BLP of one memory cell array MCAa, and switching elements SWb are provided between the sense amplifiers SA and the bit line pairs BLP of the other memory cell array MCAb. The switching elements SWa and SWb are provided for each of the bit line pairs BLP. Each of the switching elements SWa and SWb is configured by, for example, a semiconductor element (not illustrated) such as a transistor and selectively connects one bit line pair BLP to a corresponding one of the sense amplifiers SA. When one switching element SWa connects the bit line pair BLP of the memory cell array MCAa to the corresponding sense amplifier SA, the other switching element SWb electrically disconnects the bit line pair BLP of the memory cell array MCAb from that sense amplifier SA. On the contrary, when the switching element SWb connects the bit line pair BLP of the memory cell array MCAb to the sense amplifier SA, the switching element SWa electrically disconnects the bit line pair BLP of the memory cell array MCAa from that sense amplifier SA. That is, the switching elements SWa and SWb operate in a complementary manner.

During a read/write operation, either one of the switching elements SWa and SWb is in an ON state and the other is in an OFF state in such a manner that the bit line pair BLP of one of the memory cell arrays MCAa and MCAb, which includes the selected word line WL, is connected to the sense amplifier SA.

The sense amplifier SA receives reference data and signal data from the bit line pair BLP connected thereto via the switching element SWa or SWb and detects the signal data.

The semiconductor storage device 1 according to the present embodiment may have any of the folded bit-line configurations illustrated in FIGS. 3A to 3C.

Further, the present embodiment may be applied to a twisted bit-line technique. In this case, it is further possible to improve the read margin because of a noise reduction effect obtained by coupling of noise into the bit lines BL as common mode noise.

Figure 4:
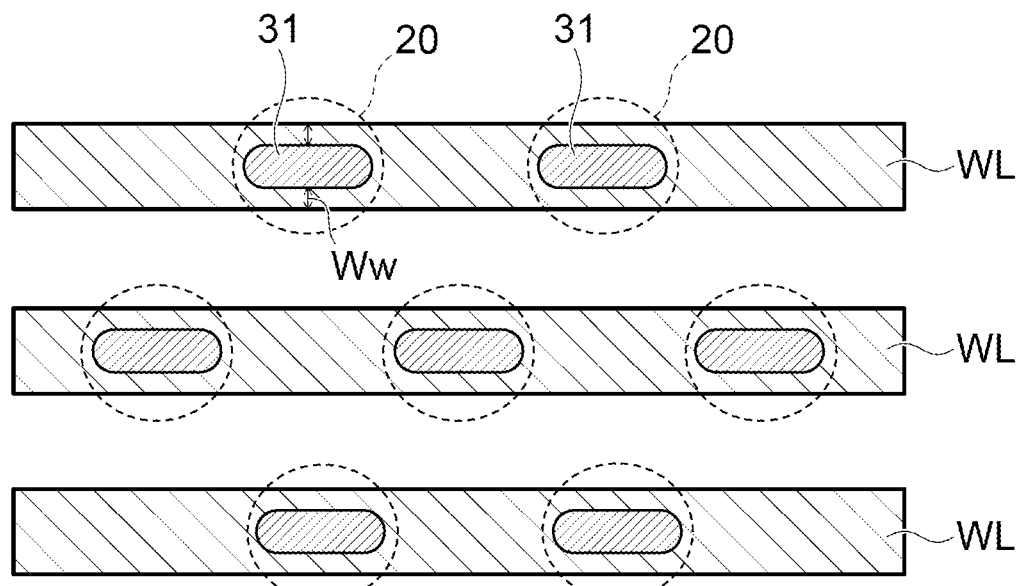
FIG. 4 is a schematic plan view illustrating a shape of a pillar.

FIG. 4 is a schematic plan view illustrating a shape of the semiconductor pillar 31. The semiconductor pillar 31 penetrates through the word line WL from the capacitor element 20 and is connected to the bit line BL. In a cross section (an X-Y cross section) substantially parallel to a surface of the semiconductor substrate 10, the shape of the semiconductor pillar 31 penetrating through the word line WL is an elongate shape that has a major axis along an extending direction of the word line WL (the X-direction), as illustrated in FIG. 4. For example, the cross-sectional shape of the semiconductor pillar 31 is a substantially elliptical shape having a major axis along the X-direction. That is, the width in the X-direction is larger than the width in the Y-direction in the cross-sectional shape of the semiconductor pillar 31. The word line WL is provided around the outer circumference of the semiconductor pillar 31, and the length of the outer circumference of the semiconductor pillar 31 is the channel width of the cell transistor 30. Therefore, the current driving capability of the cell transistor 30 is improved as the length of the outer circumference of the semiconductor pillar 31 in the X-Y cross section becomes longer. Accordingly, it is preferable that the length of the outer circumference of the semiconductor pillar 31 is longer.

Meanwhile, when a width Ww of a portion of the word line WL, through which the semiconductor pillar 31 does not penetrate (that is, the distance between a side surface of the word line WL and the semiconductor pillar 31) is narrow in the X-Y cross section, the resistance of the word line WL increases. A higher resistance of the word line WL reduces a speed of driving the word line WL, causing reduction of an operating speed of the entire device. Therefore, it is preferable that the cross-sectional shape of the cell transistor 30 in the X-Y cross section is made small and the width Ww is increased, considering the resistance of the word line WL.

Accordingly, the shape of the semiconductor pillar 31 in the X-Y cross section is set to an elongate shape having a major axis along the X-direction, thereby making the length of the outer circumference of the semiconductor pillar 31 longer and increasing the width Ww of the word line WL. This configuration eliminates a trade-off between improvement of the current driving capability of the cell transistor 30 and reduction of the resistance of the word line WL.

As described above, according to the present embodiment, it is possible to downsize the memory cell MC, reduce power consumption, and increase the speed of each of a write operation and a read operation by using an oxide semiconductor transistor as the cell transistor 30.

Further, reduction of noise immunity caused by the oxide semiconductor transistor can be prevented by employing a folded bit-line configuration.

Next, a manufacturing method of the memory cell MC according to the present embodiment is described.

FIGS. 5 to 10 are cross-sectional views illustrating an example of the manufacturing method of the memory cell MC according to the present embodiment.

First, the electrode pillars P are formed on the semiconductor substrate 10 by lithography and etching. The planar arrangement of the electrode pillars P has been described with reference to FIG. 2. For example, the centers of the electrode pillars P each have a substantially circular shape as viewed from above the semiconductor substrate 10 and are arranged in planar close packing (that is, hexagonal close packing) as described above.

Next, the insulating portion 13 is formed on the semiconductor substrate 10. The insulating portion 13 may be formed by, for example, thermal oxidation, CVD (Chemical Vapor Deposition), or ALD (Atomic Layer Deposition).

Figure 5:
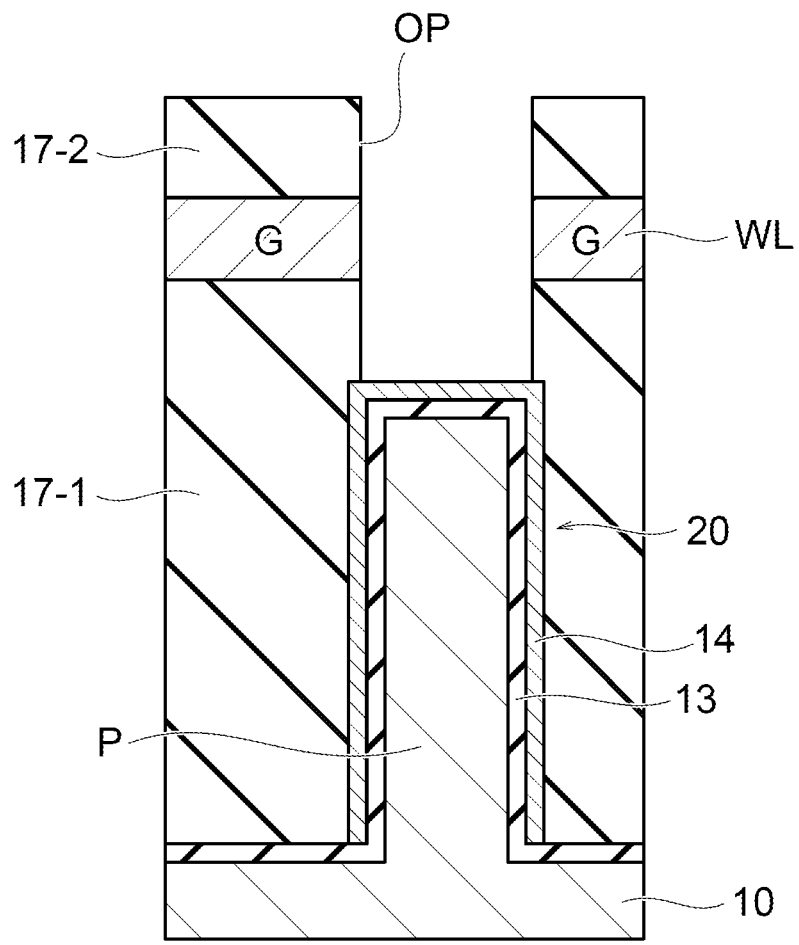
FIG. 5 is a cross-sectional view illustrating an example of a manufacturing method of a memory cell MC according to the present embodiment.

Next, a material of the cell electrode 14 is deposited on the semiconductor substrate 10 and the insulating portion 13, and the material of the cell electrode 14 on the semiconductor substrate 10 is removed by lithography and etching. Thus, the cell electrode 14 is formed on the top surface and a portion of the side surface of the insulating portion 13. Accordingly, as illustrated in FIG. 5, the capacitor element 20 that includes the electrode pillar P, the insulating portion 13, and the cell electrode 14 is formed.

Next, an interlayer dielectric film 17-1 that covers the capacitor element 20 is formed. The word line WL is formed on the interlayer dielectric film 17-1, and an interlayer dielectric film 17-2 is further formed to cover the word line WL. The interlayer dielectric films 17-1 and 17-2 may be, for example, films of silicon oxide such as TEOS (TetraEthoOxySilane).

Next, an opening OP is formed in the interlayer dielectric films 17-1 and 17-2 and the word line WL on the capacitor element 20 to correspond to the electrode pillar P by lithography and etching. The opening OP is aligned to penetrate through the word line WL. The bottom of the opening OP reaches the cell electrode 14. Accordingly, the structure illustrated in FIG. 5 is obtained.

Figure 6:
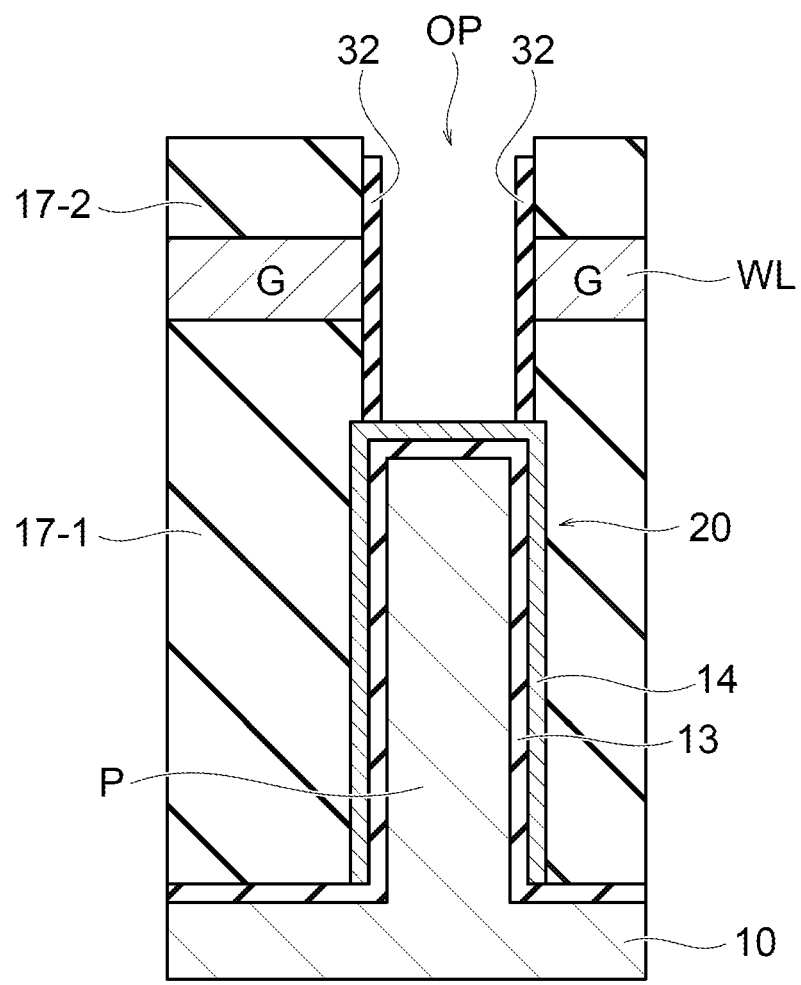
FIG. 6 is a cross-sectional view illustrating an example of the manufacturing method following FIG. 5.

Next, as illustrated in FIG. 6, a material of the gate insulating layer 32 is deposited on the interlayer dielectric film 17-2 and on the inner surface of the opening OP by CVD, ALD, or the like. Next, the gate insulating layer 32 is anisotropically etched back by RIE (Reactive Ion Etching). By this etching, as illustrated in FIG. 6, the gate insulating layer 32 on the side surface of the opening OP is left and the material of the gate insulating layer 32 on the bottom of the opening OP and on the interlayer dielectric film 17-2 is removed.

Figure 7:
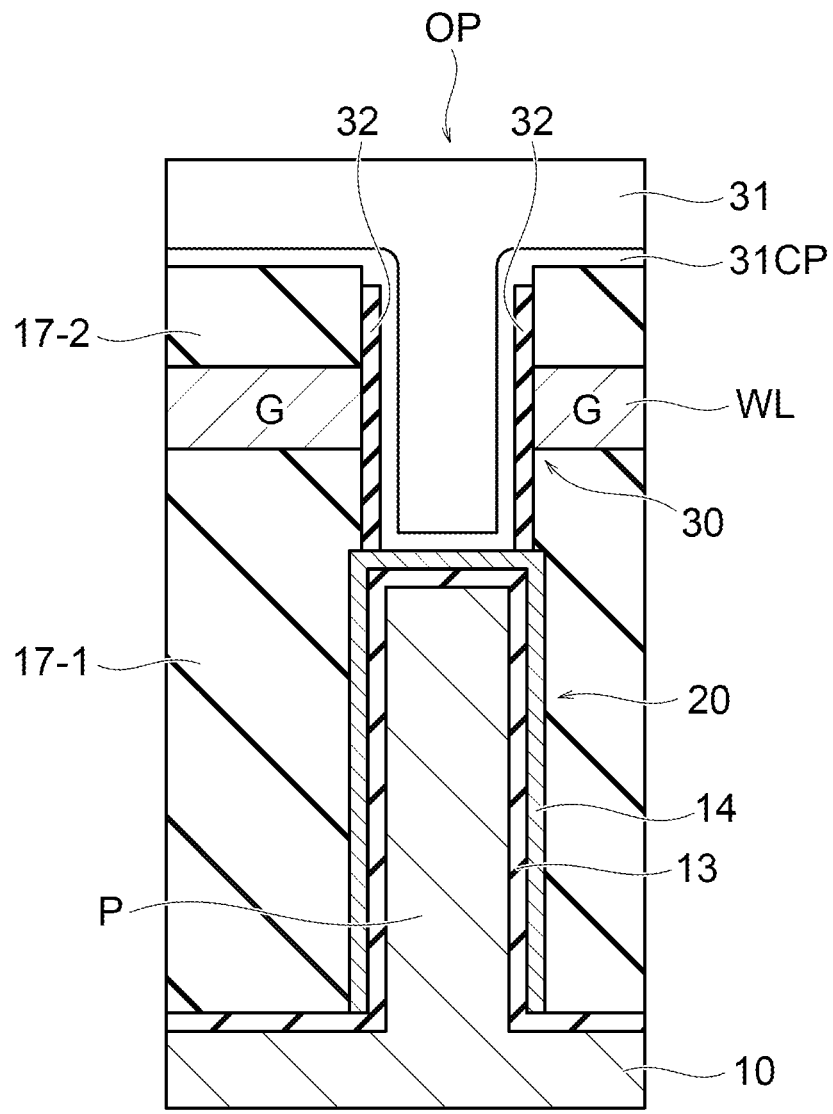
FIG. 7 is a cross-sectional view illustrating an example of the manufacturing method following FIG. 6.

Next, as illustrated in FIG. 7, a material of the supplemental layer 31CP is deposited on the interlayer dielectric film 17-2 and on the inner surface of the opening OP by CVD, ALD, or the like. Next, a material of the semiconductor pillar 31 (the oxide semiconductor) is deposited to fill the opening OP by CVD or the like.

The supplemental layer 31CP prevents formation of metal oxide with a high resistance between the material of the semiconductor pillar 31 and the cell electrode 14. Therefore, a resistance of contact between the semiconductor pillar 31 and the cell electrode 14 is reduced. Further, the supplemental layer 31CP also has a function of reducing interface scattering of carriers that move through a channel between the semiconductor pillar 31 as a channel region of the cell transistor 30 and the gate insulating layer 32. Accordingly, the carrier mobility in the cell transistor 30 can be improved.

Figure 8:
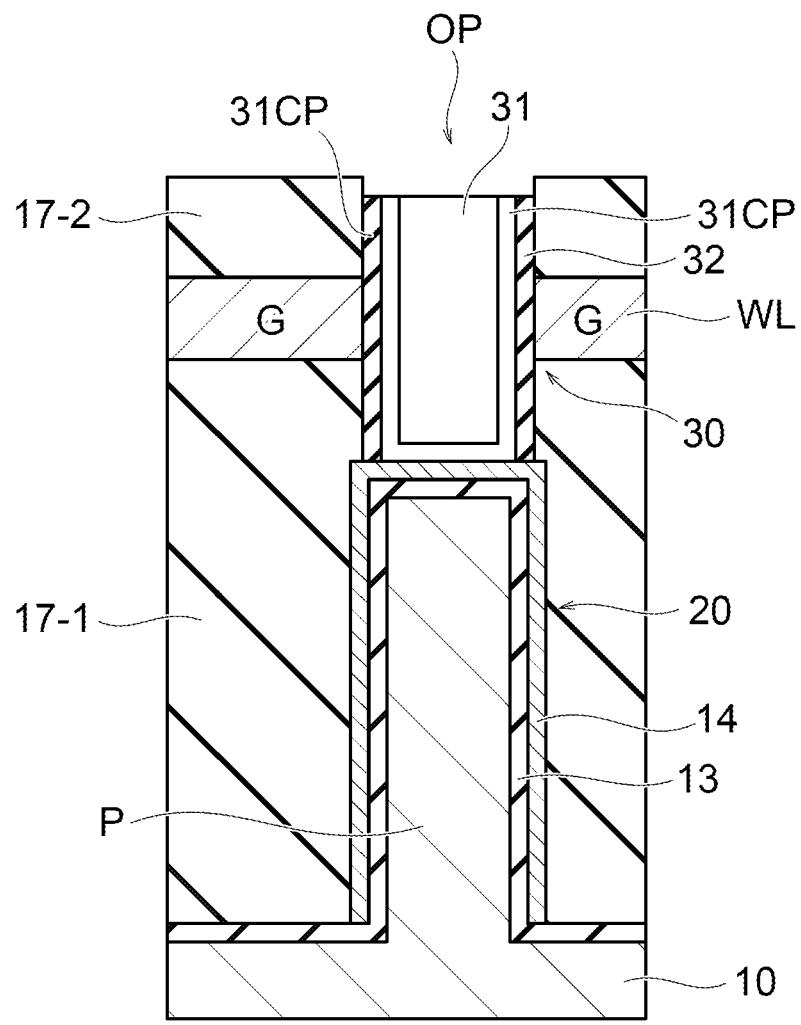
FIG. 8 is a cross-sectional view illustrating an example of the manufacturing method following FIG. 7.

Next, as illustrated in FIG. 8, the semiconductor pillar 31 and the supplemental layer 31CP are polished by CMP (Chemical Mechanical Polishing) until the interlayer dielectric film 17-2 is exposed. By this polishing, the semiconductor pillar 31 and the supplemental layer 31CP on the interlayer dielectric film 17-2 are removed, and the semiconductor pillar 31 and the supplemental layer 31CP are left in the opening OP.

Also after the top surface of the interlayer dielectric film 17-2 is exposed, it is overetched to a certain extent. Accordingly, after CMP, top surfaces of the semiconductor pillar 31 and the supplemental layer 31CP are located slightly below the top surface of the interlayer dielectric film 17-2.

Figure 9:
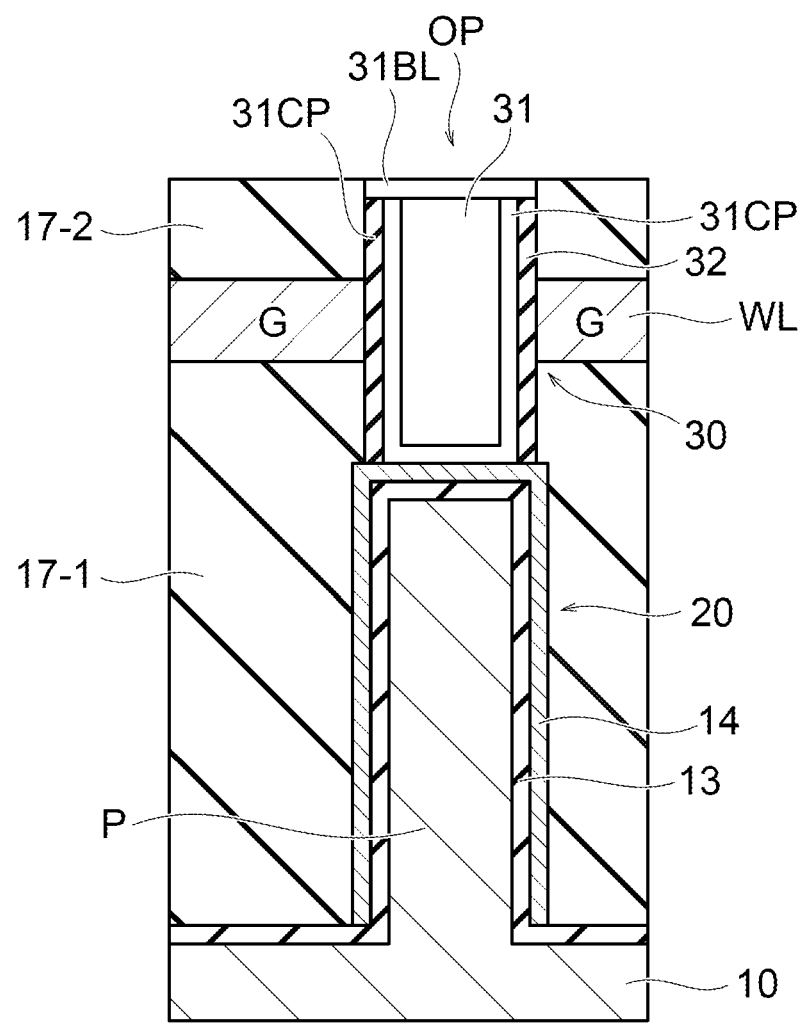
FIG. 9 is a cross-sectional view illustrating an example of the manufacturing method following FIG. 8.

Next, as illustrated in FIG. 9, a material of the supplemental layer 31BL is deposited on the interlayer dielectric film 17-2 and the semiconductor pillar 31 by CVD or the like. Next, the material of the supplemental layer 31BL is polished by CMP until the surface of the interlayer dielectric film 17-2 is exposed. By this polishing, the supplemental layer 31BL is left on the semiconductor pillar 31 in the opening OP. Accordingly, the semiconductor pillar 31 is surrounded by the supplemental layers 31CP and 31BL.

Figure 10:
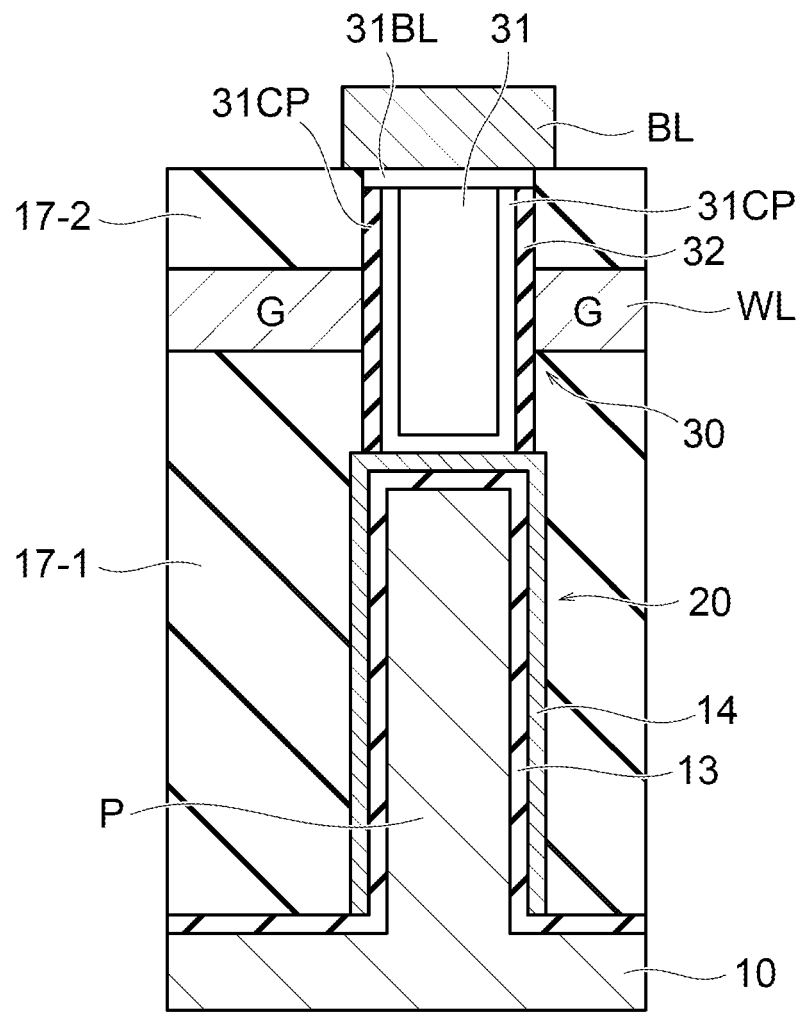
FIG. 10 is a cross-sectional view illustrating an example of the manufacturing method following FIG. 9.

Next, as illustrated in FIG. 10, the bit line BL is formed on the supplemental layer 31BL. The memory cell MC is thus formed. As described above, the supplemental layer 31BL prevents formation of metal oxide between the bit line BL and the semiconductor pillar 31. Therefore, a resistance of contact between the bit line BL and the semiconductor pillar 31 can be reduced.

Thereafter, other elements such as the interlayer dielectric film 40 and a multilayer wiring layer (not illustrated) are formed, so that the semiconductor storage device 1 according to the present embodiment is completed. The manufacturing method described above is only an example and other methods may be used.

First Modification

FIG. 11 is a cross-sectional view illustrating a first modification of the semiconductor storage device according to the above-described embodiment. In the first modification, the memory cells MC are provided on the plate electrode 12.

For example, the plate electrode 12 is provided above a semiconductor substrate 11. An interlayer dielectric film is provided between the semiconductor substrate 11 and the plate electrode 12, but no peripheral circuit is provided. The memory cells MC are arranged side by side on the plate electrode 12. The capacitor elements 20 of the memory cells MC are electrically connected to the plate electrode 12 in common. The memory cells MC arranged in the Y-direction share the bit lines BL with each other. Further, these memory cells MC are connected to different word lines WL, respectively.

The plate electrode 12 is connected to the memory cells MC in common, and is formed of an electrically conducting material, such as doped polysilicon, metal, or silicide. The plate electrode 12 is set to a fixed potential via a contact plug 19 and applies the fixed potential to the electrodes Eb of the capacitor elements 20.

The bit line BL is connected to a peripheral circuit (not illustrated) via the contact plug 18 and the transistor T. The peripheral circuit is arranged in the periphery of the memory cells MC, for example.

For example, one word line WL is selected in a read/write operation. The one selected word line WL is set to an active state (for example, a high level voltage) and the other unselected word lines are set to a non-active state (for example, a low level voltage). Accordingly, a peripheral circuit including a sense amplifier can detect charges stored in the memory cell MC connected to the selected word line WL, via the bit line BL.

Second Modification

FIG. 12 is a cross-sectional view illustrating a second modification of the semiconductor storage device according to the above-described embodiment. In the second modification, the memory cells MC are provided on the plate electrode 12 provided on a peripheral circuit 21.

For example, in FIG. 12, the peripheral circuit (CMOS (Complementary Metal Oxide Semiconductor) circuit) 21 including a sense amplifier and the like is provided on the semiconductor substrate 11, and the plate electrode 12 is provided on the peripheral circuit 21. The memory cells MC are arranged side by side on the plate electrode 12. The capacitor elements 20 of the memory cells MC are electrically connected to the plate electrode 12 in common. The memory cells MC arranged in the Y-direction share the bit lines BL with each other. Further, these memory cells MC are connected to different word lines WL, respectively.

The plate electrode 12 is connected to the memory cells MC in common, and is formed of an electrically conducting material, such as doped polysilicon, metal, or silicide. The plate electrode 12 is set to a fixed potential via the contact plug 19 and applies the fixed potential to the electrodes Eb of the capacitor elements 20.

The bit line BL is connected to the peripheral circuit 21 (including a sense amplifier) via the contact plug 18 and the transistor T. A whole or a part of the peripheral circuit 21 is arranged directly below the memory cells MC, for example.

For example, one word line WL is selected in a read/write operation. The one selected word line WL is set to an active state (for example, a high level voltage) and the other unselected word lines are set to a non-active state (for example, a low level voltage). Accordingly, the peripheral circuit 21 including a sense amplifier can detect information stored in a memory cell MC connected to the selected word line WL via the bit line BL and can write information into a memory cell MC connected to the selected word line WL via the bit line BL.

Third Modification

The memory cell MC may be provided on the peripheral circuit 21 or be arranged by the side of the peripheral circuit 21 to be adjacent thereto. In this case, the plate electrode 12 may be formed of the same material in the same layer as a wire of the peripheral circuit 21. Although a contact plug connected to the plate electrode 12 is not illustrated in FIG. 13, the plate electrode 12 is set to a fixed potential via the contact plug and applies the fixed potential to the electrodes Eb of the capacitor elements 20.

Figure 13:
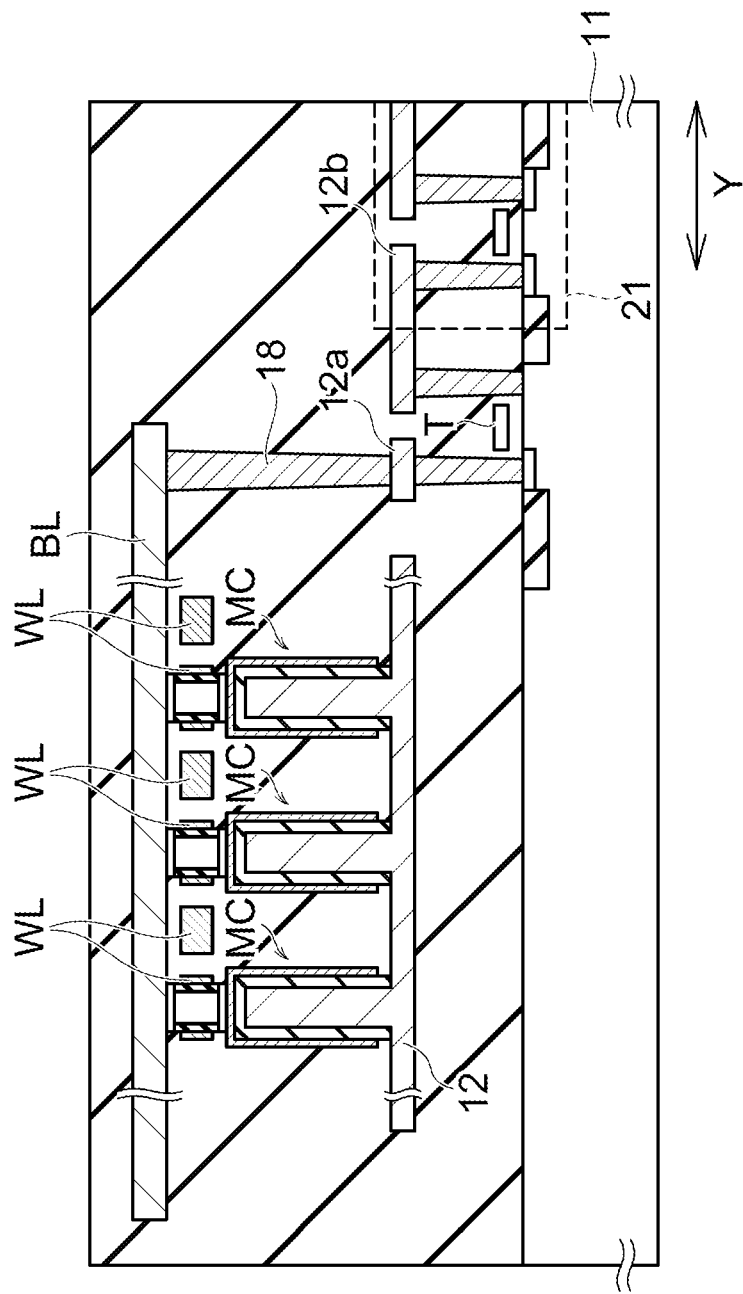
FIG. 13 is a cross-sectional view illustrating a third modification of the DRAM according to the present embodiment.

FIG. 13 is a cross-sectional view illustrating a third modification of a DRAM according to the above-described embodiment, for example. In the third modification, the memory cells MC and the peripheral circuit 21 are provided to be adjacent to each other in the Y-direction. The plate electrode 12 is formed of the same material in the same layer as a wire 12a provided in the middle of the contact plug 18 and a wire (a local wire) 12b provided in the peripheral circuit 21. When the wire 12a includes a plurality of layers, the plate electrode 12 is formed of the same material in the same layer as at least one of the layers of the wire 12a. In FIG. 13, illustration of the configuration other than the wires 12a and 12b of the peripheral circuit 21 is omitted. As described above, the plate electrode 12 may be formed simultaneously by a process of forming wires of the peripheral circuit 21. Although the contact plug 18 is connected from the bit line BL to a diffusion layer of the transistor T via the wire 12a, the contact plug 18 may be connected directly to the diffusion layer from the bit line BL not via the wire 12a.

FIGS. 14A to 14C are schematic plan views illustrating arrangements of other folded bit-line configurations. These folded bit-line configurations are identical to the configurations illustrated in FIGS. 3A to 3C in that the pair BLP of two bit lines BL is connected to one sense amplifier SA. However, in the folded bit-line configurations illustrated in FIGS. 14A to 14C, at least another bit line connected to another sense amplifier SA is arranged between the bit lines of the bit line pair connected to the one sense amplifier SA.

The semiconductor storage device 1 having any of these folded bit-line configurations can increase noise immunity by employing the folded bit-line configuration, even if the device 1 uses an oxide semiconductor transistor as the cell transistor 30 to downsize the memory cell MC and makes the pitch Pb between the bit lines BL narrow.

In the configuration in FIG. 14A, the sense amplifiers SA are arranged at both ends of the memory cell array MCA. Between the bit lines BL of the bit line pair BLP connected to sense amplifiers SAa provided at one end of the memory cell array MCA, the bit line pair BLP connected to sense amplifiers SAb provided at the other end of the memory cell array MCA are arranged. That is, another bit line pair BLP of two bit lines connected to the other sense amplifier SAb is inserted between the bit lines BL of the bit line pair BLP connected to the sense amplifier SAa.

In FIG. 14A, the sense amplifiers SAa are arranged only at one end of the memory cell array MCA, and the sense amplifiers SAb are arranged only at the other end of the memory cell array MCA. Meanwhile, in the configuration in FIG. 14B, the sense amplifiers SAa and the sense amplifiers SAb appear alternately. For example, the sense amplifiers SAa and SAb are alternately arranged in the order of the sense amplifiers SAa, SAb, SAa, . . . at one end of the memory cell array MAC. Further, the sense amplifiers SAb and SAa are alternately arranged in the order of the sense amplifiers SAb, SAa, SAb, . . . at the other end of the memory cell array MAC. This configuration may be employed.

Figure 15A:
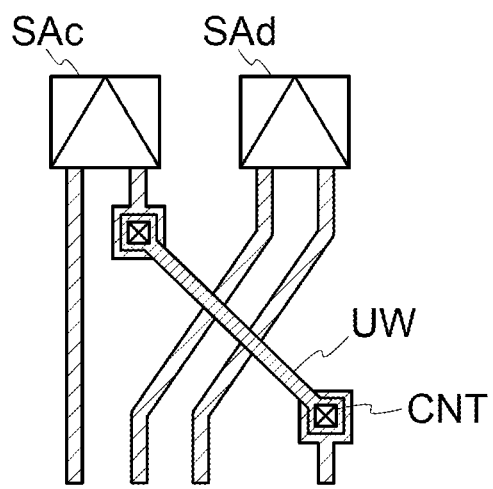
FIG. 15A is a diagram illustrating a more detailed configuration of an intersection in FIG. 14C.
Figure 15B:
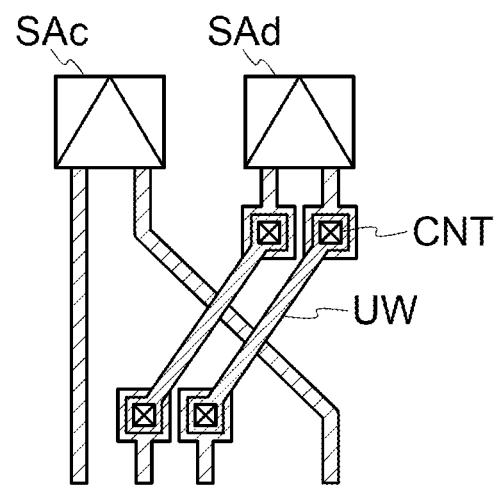
FIG. 15B is a diagram illustrating a more detailed configuration of the intersection in FIG. 14C.

In the configuration in FIG. 14C, sense amplifiers SAc and SAd are both arranged at one end of the memory cell array MCA. Between the bit lines BL of the bit line pair BLP connected to the sense amplifier SAc, the bit line pair BLP connected to the adjacent sense amplifier SAd is arranged. The bit line pair BLP connected to the sense amplifier SAd is placed above or below one of the bit lines BL of the bit line pair BLP for the sense amplifier SAc at least at an intersection with that bit line BL so as not to short-circuit that bit line BL. For example, FIGS. 15A and 15B illustrate more detailed configurations of an intersection in FIG. 14C. As illustrated in FIG. 15A, one bit line of the bit line pair BLP for the sense amplifier SAc is bypassed by an upper wire UW located above the bit line pair BLP for the sense amplifier SAd. Alternatively, as illustrated in FIG. 15B, the bit line pair BLP for the sense amplifier SAd is bypassed by the upper wire UW located above one bit line of the bit line pair BLP for the sense amplifier SAc. An interlayer dielectric film is provided between the upper wire UW and the bit line located below the upper wire UW or the bit line pair located below the upper wire UW. CNT denotes a contact between the bit line BL and the upper wire UW. By this arrangement, between the bit lines BL of the bit line pair BLP connected to the sense amplifier SAc, another bit line pair BLP of two bit lines connected to the adjacent sense amplifier SAd is inserted.

The semiconductor storage device 1 according to the present embodiment may have any configuration of folded bit-line configurations illustrated in FIGS. 14A to 14C.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first wires provided above a surface of a semiconductor substrate to extend in a first direction;
a plurality of second wires provided above the first wires to extend in a second direction crossing the first direction;
a plurality of capacitor elements corresponding to intersection regions between the first wires and the second wires as viewed from above the surface of the semiconductor substrate; and
a plurality of transistors provided above the capacitor elements to correspond thereto, respectively, wherein
each of the transistors includes a semiconductor pillar,
the semiconductor pillar penetrates through a corresponding one of the first wires,
one end of the semiconductor pillar is electrically connected to one end of a corresponding one of the capacitor elements,
the other end of the semiconductor pillar is electrically connected to a corresponding one of the second wires, and
in a cross section parallel to the surface of the semiconductor substrate, the semiconductor pillar has a width in the first direction larger than a width in the second direction.

2. The device of claim 1, wherein
the other ends of the capacitor elements are connected in common.

3. The device of claim 1, wherein
the first wires are word lines, and
the second wires are bit lines.

4. The device of claim 1, wherein centers of the capacitor elements are arranged planarly in a closed-packed manner as viewed from above the surface of the semiconductor substrate.

5. The device of claim 1, wherein four of the capacitor elements, which are adjacent to each other in the first and second directions, are located at respective vertices of a quadrangle that is substantially diamond-shaped as viewed from above the surface of the semiconductor substrate.

6. The device of claim 1, wherein three of the capacitor elements, which are adjacent to each other, are located at respective vertices of a triangle that has a side extending in the first direction as viewed from above the surface of the semiconductor substrate.

7. The device of claim 1, wherein each of the transistors is a three-terminal element.

8. The device of claim 7, wherein a source terminal, a drain terminal, and a gate terminal of each of the transistors are respectively connected to one electrode of a capacitor element, one of the second wires, and one of the first wires.

9. The device of claim 1, wherein the semiconductor pillar includes an oxide semiconductor.

10. The device of claim 1, wherein each of the transistors is an oxide semiconductor transistor that includes an oxide semiconductor in a current path of the transistor.

11. The device of claim 1, wherein in a cross section parallel to the surface of the semiconductor substrate, the semiconductor pillar has an elongate shape having a major axis in the first direction.

12. The device of claim 1, wherein one of the capacitor elements and a corresponding one of the transistors configure one memory cell.

13. The device of claim 1, wherein one of the capacitor elements and corresponding one of the transistors are included in one memory cell.

14. The device of claim 1, wherein
a first distance between two of the capacitor elements, which are adjacent to each other in the first direction, is narrower than a second distance between two of the capacitor elements, which are adjacent to each other in the second direction.

15. A semiconductor storage device comprising:
a plurality of first wires provided above a surface of a semiconductor substrate to extend in a first direction;
a plurality of second wires provided above the first wires to extend in a second direction crossing the first direction;
a capacitor element corresponding to one of intersection regions between the first wires and the second wires as viewed from above the surface of the semiconductor substrate; and
a transistor provided above the capacitor element, wherein
the transistor includes a semiconductor pillar,
the semiconductor pillar penetrates through a corresponding one of the first wires,
one end of the semiconductor pillar is electrically connected to the capacitor element,
the other end of the semiconductor pillar is electrically connected to a corresponding one of the second wires, and
in a cross section parallel to the surface of the semiconductor substrate, the semiconductor pillar has a width in the first direction larger than a width in the second direction.

16. The device of claim 15, wherein the transistor is a three-terminal element.

17. The device of claim 16, wherein a source terminal, a drain terminal, and a gate terminal of the transistor are respectively connected to one electrode of the capacitor element, one of the second wires, and one of the first wires.

18. The device of claim 15, wherein the transistor is an oxide semiconductor transistor that includes an oxide semiconductor in a current path of the transistor.

19. The device of claim 15, wherein in a cross section parallel to the surface of the semiconductor substrate, the semiconductor pillar has an elongate shape having a major axis in the first direction.

20. The device of claim 15, wherein the capacitor element and the transistor configure a memory cell.

* * * * *